(12) United States Patent
Oh

(10) Patent No.: US 11,177,004 B2
(45) Date of Patent: Nov. 16, 2021

(54) SEMICONDUCTOR MEMORY DEVICE INCLUDING PAGE BUFFERS

(71) Applicant: SK hynix Inc., Icheon-si (KR)

(72) Inventor: Sung Lae Oh, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/897,140

(22) Filed: Jun. 9, 2020

(65) Prior Publication Data

US 2021/0217478 A1 Jul. 15, 2021

(30) Foreign Application Priority Data

Jan. 14, 2020 (KR) .................. 10-2020-0004647

(51) Int. Cl.
| | |
|---|---|
| *G11C 16/04* | (2006.01) |
| *G11C 16/14* | (2006.01) |
| *H01L 25/065* | (2006.01) |
| *H01L 25/18* | (2006.01) |
| *H01L 23/00* | (2006.01) |

(52) U.S. Cl.
CPC .......... *G11C 16/14* (2013.01); *G11C 16/0483* (2013.01); *H01L 24/08* (2013.01); *H01L 25/0657* (2013.01); *H01L 25/18* (2013.01); *H01L 2224/08145* (2013.01); *H01L 2225/06524* (2013.01); *H01L 2924/1431* (2013.01); *H01L 2924/14511* (2013.01)

(58) Field of Classification Search
CPC ..... G11C 16/14; G11C 16/0483; H01L 24/08; H01L 25/08; H01L 25/0657; H01L 25/18
See application file for complete search history.

(56) References Cited

U.S. PATENT DOCUMENTS

| 7,005,329 | B2 * | 2/2006 | Shin ................... | H01L 27/10858 |
| | | | | 257/E21.65 |
| 7,863,117 | B2 * | 1/2011 | Mousa ................ | H01L 25/18 |
| | | | | 438/150 |
| 2015/0008526 | A1 * | 1/2015 | Yasuda .............. | H01L 29/1083 |
| | | | | 257/368 |
| 2020/0161294 | A1 * | 5/2020 | Lee .................... | H01L 27/124 |

FOREIGN PATENT DOCUMENTS

| KR | 10-2009-0014003 A | 2/2009 |
| KR | 10-2018-0107622 A | 10/2018 |

* cited by examiner

*Primary Examiner* — Pho M Luu

(57) ABSTRACT

A semiconductor memory device includes at least two transistors, each including a gate that traverses, in a first direction, an active region of a first substrate defined by an isolation layer, and junction regions disposed in the active region on opposite sides of the gate, and coupled to a memory cell array through a bit line; and a plurality of contacts, coupled respectively to the junction regions, that pass through a dielectric layer that covers the transistor. Among the plurality of contacts, a contact coupled to a junction region to which an erase voltage is loaded is disposed at a center portion of the active region in the first direction, and a contact coupled to a junction region to which the erase voltage is not loaded is disposed at an edge portion of the active region in the first direction.

17 Claims, 13 Drawing Sheets

SEMICONDUCTOR MEMORY DEVICE INCLUDING PAGE BUFFERS

CROSS-REFERENCE TO RELATED APPLICATION

The present application claims priority under 35 U.S.C. § 119(a) to Korean Patent Application No. 10-2020-0004647 filed in the Korean Intellectual Property Office on Jan. 14, 2020, which is incorporated herein by reference in its entirety.

BACKGROUND

1. Technical Field

Various embodiments generally relate to a semiconductor memory device, and particularly, to a semiconductor memory device including page buffers.

2. Related Art

A volatile memory device has high write and read speeds, but may lose data stored therein if power supply is interrupted. A nonvolatile memory device has relatively low write and read speeds, but may retain data stored therein even though power supply is interrupted. Therefore, in order to store data which should be retained regardless of power supply, a nonvolatile memory device is often used.

NAND flash memory devices are widely used in data storage devices with nonvolatile memory. The NAND flash memory device may perform operations necessary to read and output data stored in memory cells using a plurality of page buffers.

As semiconductor manufacturing technology continues to improve, the degree of integration and the storage capacity of nonvolatile memory devices are also progressing. The high integration in nonvolatile memory devices has the advantage of reducing manufacturing cost. However, various problems arise as scale is decreased, and as structural changes are required for high integration. A decrease in the reliability of nonvolatile memory devices that have such structural changes has been a recently identified problem. There is continuous demand for new methods and technologies for preventing problems like a decrease in the reliability due to high integration.

SUMMARY

Various embodiments of the disclosure are directed to a semiconductor memory device with improved reliability.

In an embodiment, a semiconductor memory device may include: at least two transistors, each including a gate that traverses, in a first direction, an active region of a first substrate defined by an isolation layer, and junction regions disposed in the active region on opposite sides of the gate, and coupled to a memory cell array through a bit line; and a plurality of contacts, coupled respectively to the junction regions, that pass through a dielectric layer that covers the at least two transistors. Among the plurality of contacts, a contact coupled to a junction region to which an erase voltage is loaded may be disposed at a center portion of the active region in the first direction, and a contact coupled to a junction region to which the erase voltage is not loaded may be disposed at an edge portion of the active region in the first direction.

In an embodiment, a semiconductor memory device may include: an active region of a first substrate defined by an isolation layer; a first transistor including a gate that traverses, in a first direction, the active region on the first substrate and junction regions that are defined in the active region on opposite sides of the gate, and coupled to a memory cell array through an even bit line; a second transistor including a gate which traverses, in the first direction, the active region on the first substrate, and junction regions that are defined in the active region on opposite sides of the gate, and coupled to the memory cell array through an odd bit line; and a plurality of contacts, coupled to the junction regions of the first and second transistors, that pass through a dielectric layer covering the first and second transistors. Among the plurality of contacts, a contact coupled to a junction region to which an erase voltage is loaded may be disposed at a center portion of the active region in the first direction, and a contact coupled to a junction region to which the erase voltage is not loaded may be disposed at an edge portion of the active region in the first direction.

DETAILED DESCRIPTION

Figure 1:
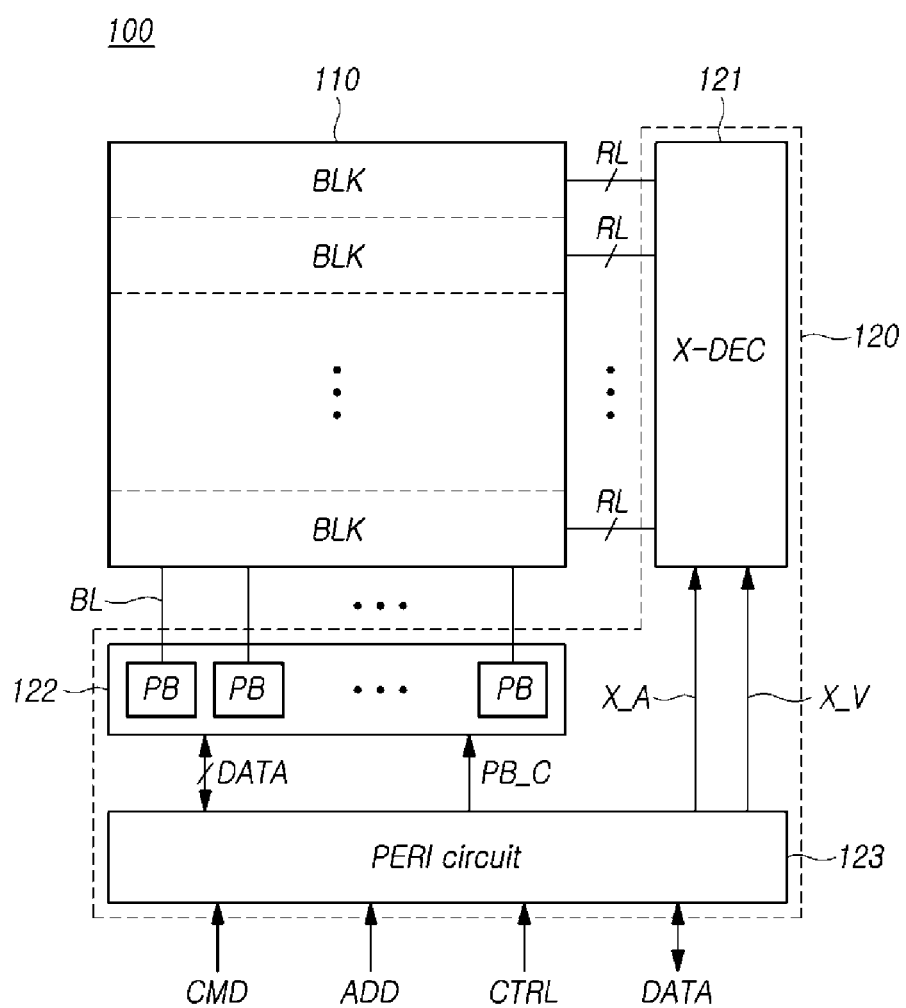
FIG. 1 is a block diagram illustrating a representation of a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise.

Elements in embodiments of the disclosure should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram illustrating a representation of a semiconductor memory device in accordance with an embodiment of the disclosure.

Referring to FIG. 1, a semiconductor memory device 100 in accordance with an embodiment of the disclosure may include a memory cell array 110, a row decoder (X-DEC) 121, a page buffer circuit 122 and a peripheral circuit (PERI circuit) 123.

The memory cell array 110 may include a plurality of memory blocks BLK. While not illustrated, each of the memory blocks BLK may include a plurality of memory cells. Each memory cell may be a volatile memory cell or may be a nonvolatile memory cell. While embodiments herein describe a semiconductor memory device that is a vertical NAND flash device, it is to be understood that the technical spirit of the disclosure is not limited thereto.

The memory cell array 110 may be coupled to the row decoder 121 through row lines RL. The row decoder 121 may select any one among the memory blocks BLK included in the memory cell array 110, in response to a row address X_A provided from the peripheral circuit 123. The row decoder 121 may transfer an operating voltage X_V, provided from the peripheral circuit 123, to row lines RL coupled to a memory block BLK that is selected from among the memory blocks BLK included in the memory cell array 110.

The memory cell array 110 may be coupled to the page buffer circuit 122 through bit lines BL. The page buffer circuit 122 may include a plurality of page buffers PB, which are coupled to the bit lines BL, respectively. The page buffer circuit 122 may receive a page buffer control signal PB_C from the peripheral circuit 123, and may transmit and receive a data signal DATA to and from the peripheral circuit 123. The page buffer circuit 122 may control the bit lines BL, which are arranged in the memory cell array 110, in response to the page buffer control signal PB_C. For example, the page buffer circuit 122 may detect data stored in a memory cell of the memory cell array 110 by sensing the signal of a bit line BL of the memory cell array 110 in response to the page buffer control signal PB_C, and may transmit the data signal DATA to the peripheral circuit 123 depending on the detected data. The page buffer circuit 122 may apply a signal to a bit line BL based on the data signal DATA received from the peripheral circuit 123 in response to the page buffer control signal PB_C, and thereby, may write data in a memory cell of the memory cell array 110. The page buffer circuit 122 may write or read data in or from a memory cell which is coupled to a word line activated by the row decoder 121.

The peripheral circuit 123 may receive a command signal CMD, an address signal ADD and a control signal CTRL from outside the semiconductor memory device 100, and may transmit and receive data DATA to and from a device outside the semiconductor memory device 100, such as for example, a memory controller. The peripheral circuit 123 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages including the operating voltage X_V, which are required in the semiconductor memory device 100.

The row decoder 121, the page buffer circuit 122 and the peripheral circuit 123 may configure a logic circuit 120. The logic circuit 120 may be disposed under the memory cell array 110. This structure may be defined as a PUC (peri under cell) structure. The memory cell array 110 and the logic circuit 120 may be fabricated on different wafers, and then, may be bonded and coupled into one. This structure may be defined as a POC (peri over cell) structure. The semiconductor memory device 100, in accordance with an embodiment of the disclosure, may include either a PUC or a POC structure.

Figure 2:
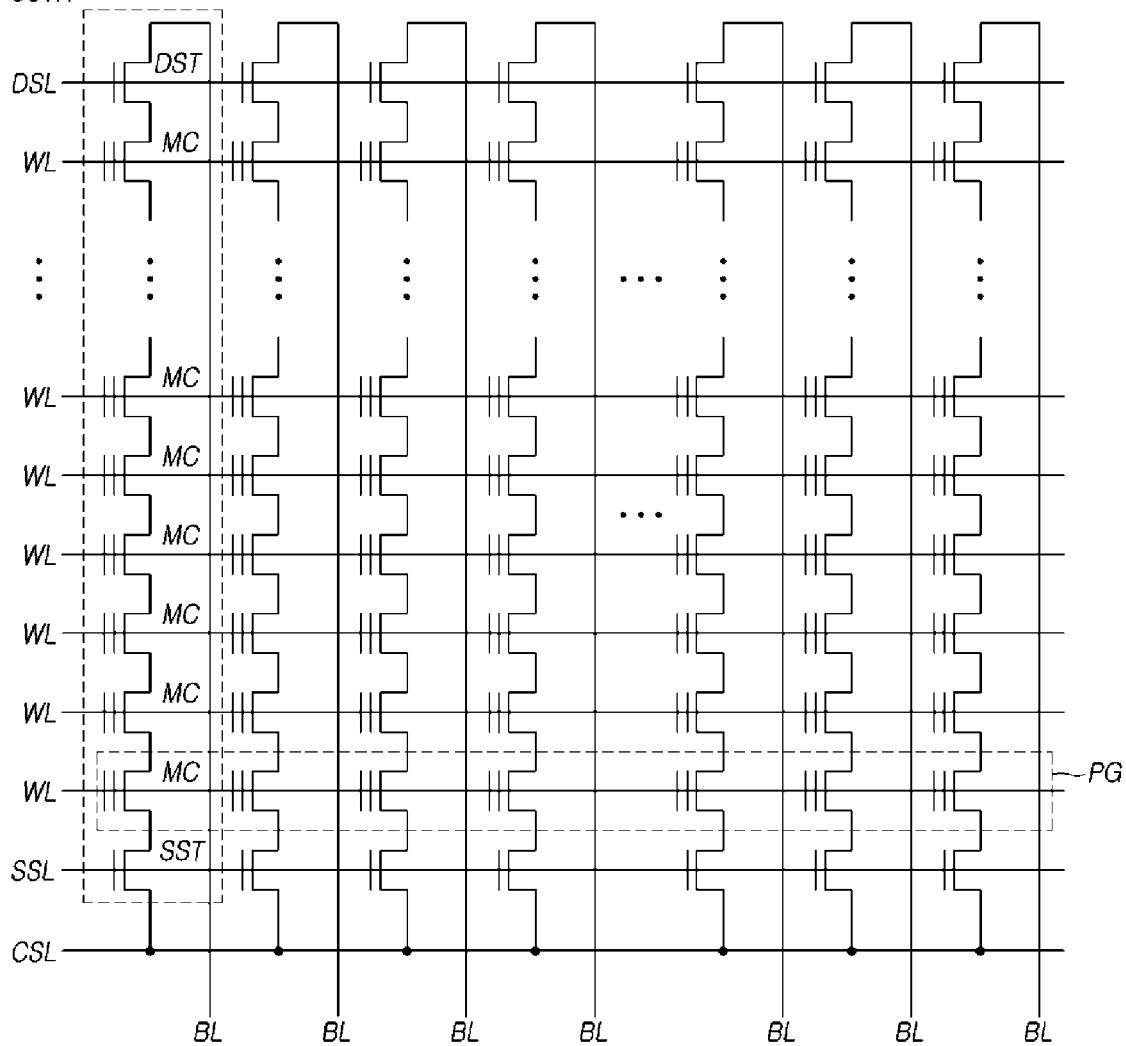
FIG. 2 is an equivalent circuit diagram illustrating a representation of one of memory blocks illustrated in FIG. 1.

FIG. 2 is an equivalent circuit diagram illustrating an example of one of the memory blocks BLK illustrated in FIG. 1.

Referring to FIG. 2, a memory block BLK may include a plurality of cell strings CSTR, corresponding to a plurality of bit lines BL, and a common source line CSL.

Each of the cell strings CSTR may be coupled between a corresponding bit line BL and the common source line CSL. Each of the cell strings CSTR may include a source select transistor SST, which is coupled to the common source line CSL, a drain select transistor DST, which is coupled to the bit line BL, and a plurality of memory cells MC, which are coupled between the source select transistor SST and the drain select transistor DST. The gate of the source select transistor SST may be coupled to a source select line SSL. The gates of the memory cells MC may be coupled to corresponding word lines WL, respectively. The gate of the drain select transistor DST may be coupled to a drain select line DSL.

The source select line SSL, the word lines WL and the drain select line DSL may be disposed or arranged in a direction perpendicular to the bit lines BL. The source select line SSL, the word lines WL and the drain select line DSL may form a three-dimensional structure by being stacked on a surface of a substrate in a vertical direction.

The memory cells MC included in the memory block BLK may be divided into physical page units or logical page units. For example, memory cells MC that share a word line WL and are coupled to different cell strings CSTR may configure one physical page PG. Such a page may be a basic unit of a read operation.

Although it is illustrated in FIG. 2 that one drain select transistor DST and one source select transistor SST are provided in each of the cell strings CSTR, it is to be noted that at least two drain select transistors or at least two source select transistors may be provided in each of the cell strings CSTR.

Figure 3:
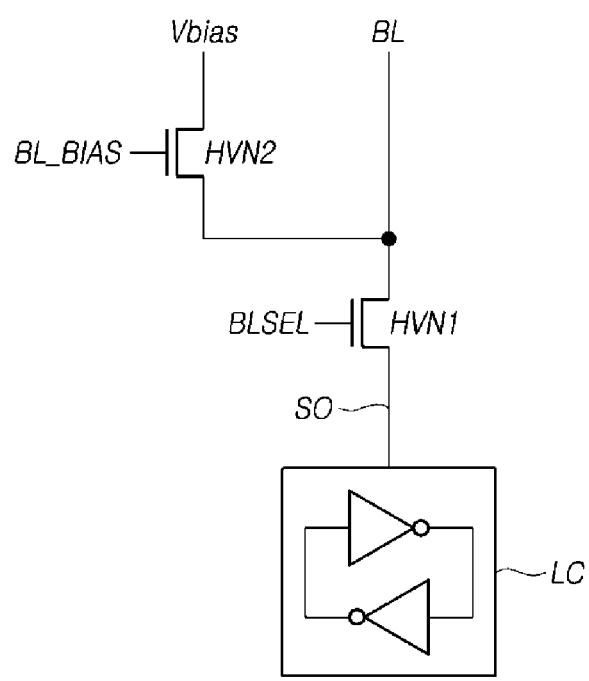
FIG. 3 is a circuit diagram illustrating a representation of a page buffer illustrated in FIG. 1.

FIG. 3 is a circuit diagram illustrating a representation of a page buffer illustrated in FIG. 1.

Referring to FIG. 3, the page buffer PB may include a bit line select transistor HVN1, a bit line bias transistor HVN2, and a latch LC.

The bit line select transistor HVN1 may be coupled between a bit line BL and a sensing node SO, and may couple the bit line BL and the sensing node SO in response to a bit line select signal BLSEL. When the bit line select signal BLSEL is activated, the bit line select transistor HVN1 may couple the bit line BL and the sensing node SO. When the bit line select signal BLSEL is deactivated, the bit line select transistor HVN1 may decouple the bit line BL and the sensing node SO.

The latch LC may apply a voltage to the sensing node SO based on data stored therein. The voltage applied to the sensing node SO may be transferred to the bit line BL through the bit line select transistor HVN1. The latch LC may perform a latch based on the voltage of the sensing node SO. The latch may be performed based on the voltage transferred to the sensing node SO through the bit line select transistor HVN1 from the bit line BL.

The bit line bias transistor HVN2 may be coupled between a bias voltage Vbias and the bit line BL, and may couple the bit line BL and the bias voltage Vbias in response to a bit line bias signal BL_BIAS. In a test operation, a stress voltage may be provided as the bias voltage Vbias. In an erase operation, an erase voltage may be provided as the bias voltage Vbias. The erase voltage has a larger value than the stress voltage.

If the bit line bias signal BL_BIAS is activated in a test operation, then the bit line bias transistor HVN2 may couple the bias voltage Vbias and the bit line BL, and accordingly, a stress voltage provided as the bias voltage Vbias may be transferred to the bit line BL.

If the bit line bias signal BL_BIAS is activated in an erase operation, then the bit line bias transistor HVN2 may couple the bias voltage Vbias and the bit line BL, and accordingly, an erase voltage provided as the bias voltage Vbias may be transferred to the bit line BL.

If the bit line bias signal BL_BIAS is deactivated, then the bit line bias transistor HVN2 may decouple the bias voltage Vbias and the bit line BL.

In an erase operation, the bit line select signal BLSEL may be deactivated, and the bit line bias signal BL_BIAS may be activated. If the bit line bias signal BL_BIAS is activated, then the bit line bias transistor HVN2 may be turned on, and thereby, an erase voltage having a high level may be applied to the bit line bias transistor HVN2 and the bit line select transistor HVN1. In order to withstand the erase voltage having a high level, the bit line bias transistor HVN2 and the bit line select transistor HVN1 may be configured by high-voltage transistors. If the bit line select signal BLSEL is deactivated in the erase operation, then the bit line select transistor HVN1 may be turned off, and thereby, the erase voltage may not be transferred to the latch LC. The latch LC may be configured by low-voltage transistors.

As semiconductor memory devices become increasingly integrated, the voltage level required for an erase operation is gradually increasing. In order to withstand a high erase voltage, high-voltage transistors which configure a page buffer should have a high drain-source breakdown voltage (a breakdown voltage of a drain-source substrate: BVDSS). If the BVDSS of the high-voltage transistors that configure the page buffer decreases, then lower level erase voltages may inadvertently configure page buffers in error. In such instances, because an erase operation is not properly performed, the reliability of the semiconductor memory device may be markedly degraded.

Figure 4A:
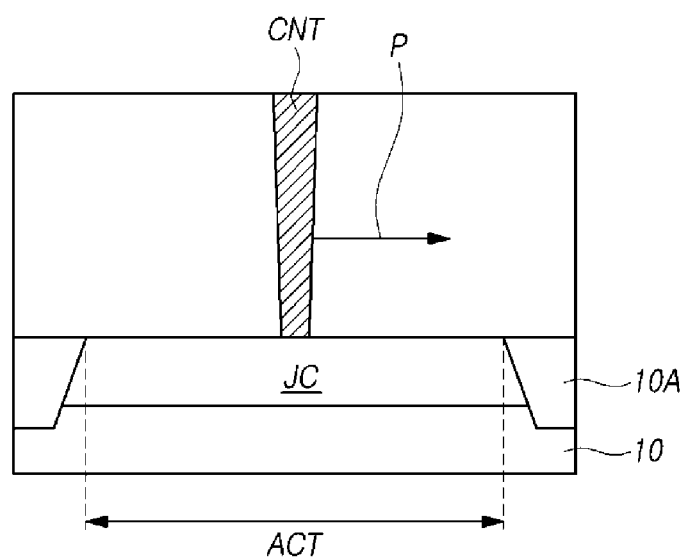
FIGS. 4A and 4B illustrate a change in the drain-source breakdown voltage (breakdown voltage of a drain-source substrate: BVDSS) of a high-voltage transistor of a page buffer depending on a change in position of a contact.
Figure 4B:
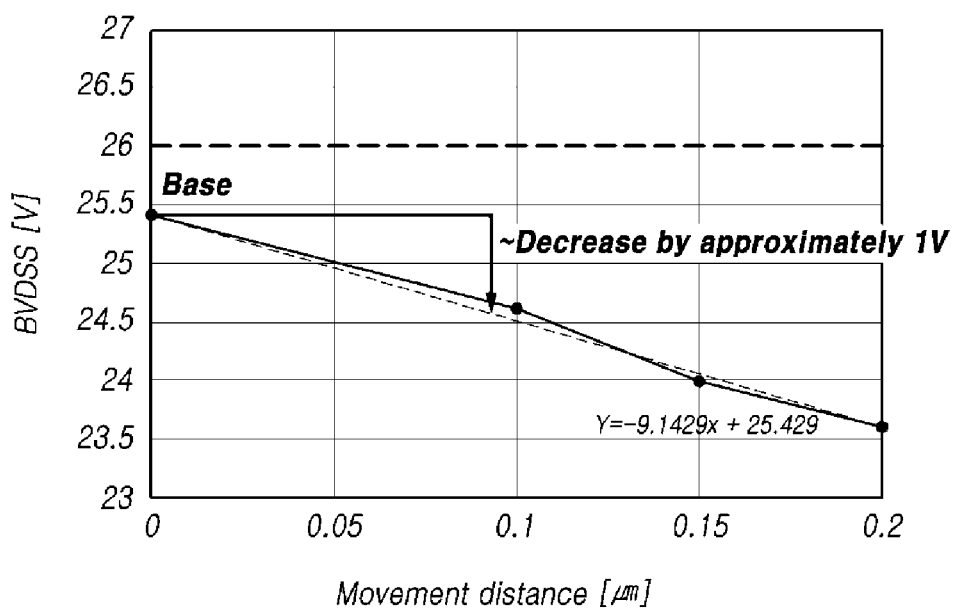

FIGS. 4A and 4B illustrate a change in the BVDSS of a high-voltage transistor of a page buffer depending on a change in position of a contact.

Referring to FIG. 4A, a junction region JC of a high-voltage transistor of a page buffer is defined in an active region ACT of a substrate 10. Active region ACT is defined by an isolation layer 10A, and a contact CNT is coupled onto the junction region JC.

A result of measuring a BVDSS while moving the contact CNT in a direction indicated by the arrow P, from a center portion of the active region ACT toward an edge of the active region ACT, is shown in the graph of FIG. 4B. For example, a BVDSS is measured with a value of approximately 25.5V when the contact CNT is positioned at or near the center portion of the active region ACT. The BVDSS gradually decreases as the contact CNT is moved in direction P towards the edge of the active region ACT, and measures approximately 24.5V when the contact CNT reaches the edge of the active region ACT.

As a result of market factors, buyers are highly sensitive to the price of semiconductor memory devices. Reducing the number of manufacturing steps in a manufacturing process is a very important factor in reducing manufacturing time and cost. Further, by simplifying the manufacturing process by reducing the number of manufacturing steps, it is also possible to reduce failures that occur with fewer manufacturing steps. For example, reducing the number of wiring layers used for the disposition of wiring lines coupled to page buffers has been attempted as a measure for reducing the number of manufacturing steps.

According to the experimental results described above with reference to FIGS. 4A and 4B, in order to keep the BVDSS of a high-voltage transistor of a page buffer high, the contact CNT coupled to the high-voltage transistor of the page buffer should be positioned at or near the center portion of the active region ACT. However, if a small number of wiring layers are used, then as the positional limitations of wiring lines increase, it may be difficult to dispose all of contacts CNT at or near the center portion of active regions. Consequently, the BVDSS of the high-voltage transistor of the page buffer decreases as contacts CNT are forced away from the center portion.

Embodiments herein disclose methods of keeping the BVDSS of a high-voltage transistor of a page buffer high while reducing the number of wiring layers used for the disposition of wiring lines coupled to page buffers.

Figure 5:
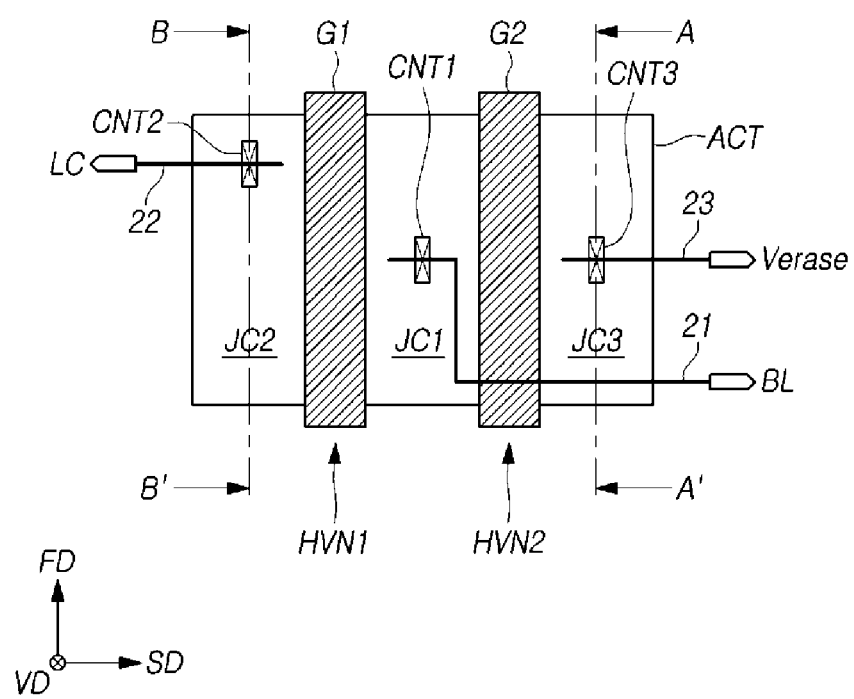
FIG. 5 is a top view illustrating an example of a semiconductor memory device in accordance with an embodiment of the disclosure.
Figure 6:
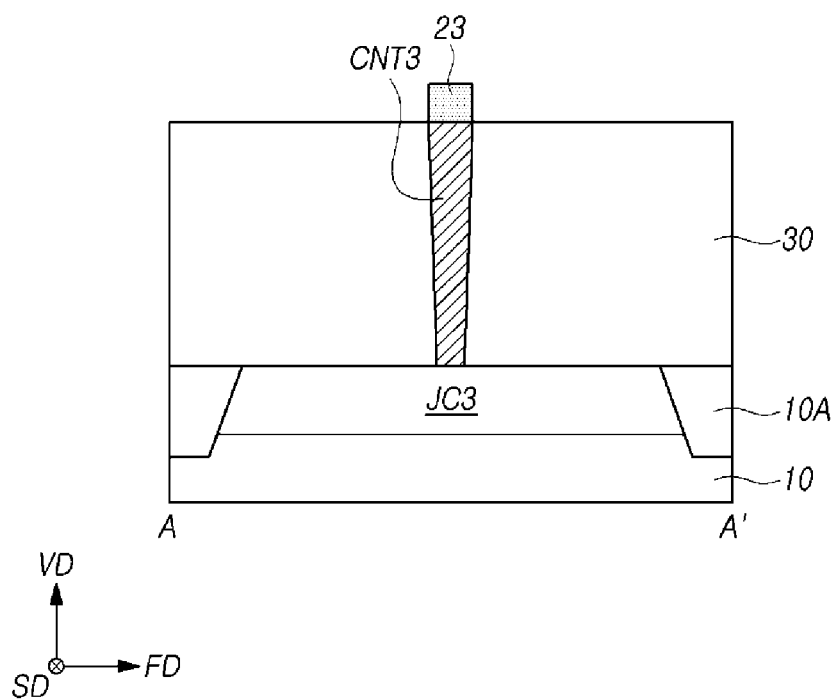
FIG. 6 is a cross-sectional view taken along the line A-A' of FIG. 5.

FIG. 5 is a top view illustrating an example of a semiconductor memory device in accordance with an embodiment of the disclosure. FIG. 6 is a cross-sectional view taken along the line A-A' of FIG. 5, and FIG. 7 is a cross-sectional view taken along the line B-B' of FIG. 5.

Figure 7:
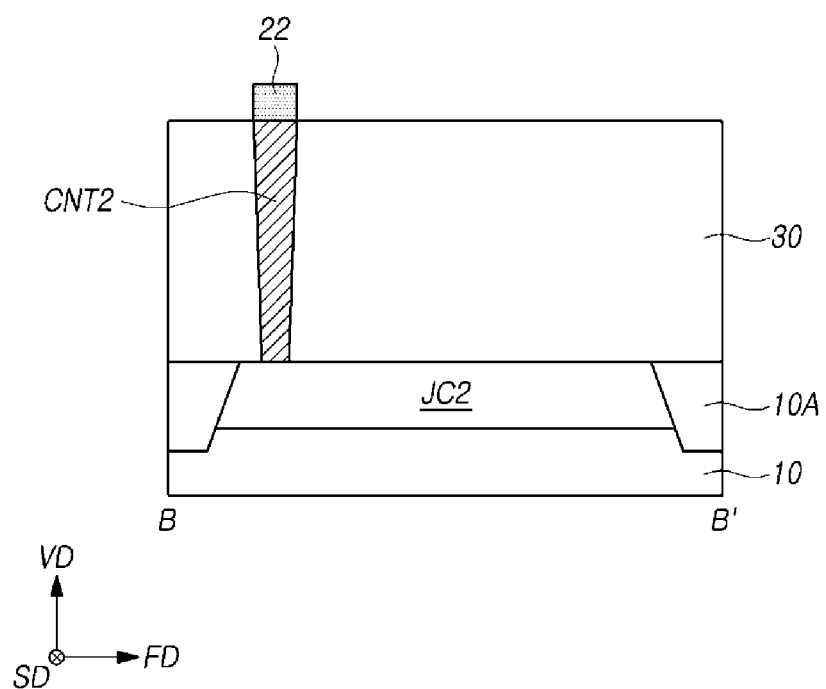
FIG. 7 is a cross-sectional view taken along the line B-B' of FIG. 5.

Referring to FIGS. 5 to 7, a first gate electrode G1 and a second gate electrode G2 are defined on and traverse, in a first direction FD, an active region ACT of a substrate 10. Active region ACT is defined by an isolation layer 10A of the substrate 10. The first gate electrode G1 and the second gate electrode G2 may extend in the first direction FD, and may be arranged in a second direction SD.

A first junction region JC1 is defined in the active region ACT between the first gate electrode G1 and the second gate electrode G2. A second junction region JC2 is defined in the active region ACT that is adjacent to the first junction region JC1, in the second direction SD, with the first gate electrode G1 interposed therebetween. A third junction region JC3 is defined in the active region ACT that is adjacent to the first junction region JC1, in the second direction SD, with the second gate electrode G2 interposed therebetween. The first junction region JC1, the second junction region JC2 and the third junction region JC3 may be arranged substantially in a line in the second direction SD.

The first gate electrode G1, the first junction region JC1 and the second junction region JC2 may configure a bit line select transistor HVN1. The second gate electrode G2, the first junction region JC1 and the third junction region JC3 may configure a bit line bias transistor HVN2. The bit line select transistor HVN1 and the bit line bias transistor HVN2 may share the first junction region JC1. The first direction FD may correspond to a channel width direction of the bit line select transistor HVN1 and the bit line bias transistor HVN2. The second direction SD may correspond to a channel length direction of the bit line select transistor HVN1 and the bit line bias transistor HVN2.

Although the present embodiment illustrates a case in which the bit line select transistor HVN1 and the bit line bias transistor HVN2 are disposed in a single active region and share the first junction region JC1, it is to be noted that the disclosure is not limited thereto. The bit line select transistor HVN1 and the bit line bias transistor HVN2 may be disposed in separate active regions, and in such instances, do not share a junction region.

Referring to FIGS. 5 to 7, a dielectric layer 30 may be defined on the substrate 10 to cover the bit line select transistor HVN1 and the bit line bias transistor HVN2. A first contact CNT1, which passes through the dielectric layer 30, may be defined on the first junction region JC1 to be coupled to the first junction region JC1. A second contact CNT2, which passes through the dielectric layer 30, may be defined on the second junction region JC2 to be coupled to the second junction region JC2. A third contact CNT3, which passes through the dielectric layer 30, may be defined on the third junction region JC3 to be coupled to the third junction region JC3.

A plurality of wiring lines 21, 22 and 23 may be defined on the dielectric layer 30 to be coupled to the first to third contacts CNT1, CNT2 and CNT3, respectively. The first contact CNT1 may be coupled to a bit line BL through the wiring line 21. The second contact CNT2 may be coupled to a latch LC through the wiring line 22. The third contact CNT3 may be coupled to an erase voltage Verase through the wiring line 23. The wiring lines 21 to 23 may be routed generally or substantially in the second direction SD being the arrangement direction of the junction regions JC1 to JC3.

As described above with reference to FIG. 3, in an erase operation, the bit line bias transistor HVN2 is turned on, and the bit line select transistor HVN1 is turned off. Therefore, in an erase operation, the erase voltage Verase is loaded to the first junction region JC1 and the third junction region JC3, but is not loaded to the second junction region JC2. The first junction region JC1 and the third junction region JC3, to which the erase voltage Verase is loaded in the erase operation, may be defined as high voltage nodes, and the second junction region JC2, to which the erase voltage Verase is not loaded in the erase operation, may be defined as a low voltage node.

In the erase operation, the bit line bias transistor HVN2 is turned on, and thereby, the erase voltage Verase is transferred to the bit line BL through the bit line bias transistor HVN2. Therefore, the erase voltage Verase having a high level may be used only when the BVDSS of the bit line bias transistor HVN2 is kept high. The bit line select transistor HVN1, however, is turned off in the erase operation so that the erase voltage Verase having a high level may be used even through the BVDSS of the bit line select transistor HVN1 is not kept high.

The first and third contacts CNT1 and CNT3, which are coupled to the first and third junction regions JC1 and JC3 of the bit line bias transistor HVN2, may be disposed at or near a center portion of the active region ACT in the first direction FD. The second contact CNT2, which is coupled to the second junction region JC2, may be disposed at or near an edge portion of the active region ACT in the first direction FD.

Such disposition of the contacts CNT1 to CNT3 may reduce the concentration of the wiring lines 21 through 23 coupled to the contacts CNT1 to CNT3 at the center portion of the active region ACT, and accordingly, the wiring lines 21 to 23 may be disposed using a smaller number of wiring layers.

Figure 8:
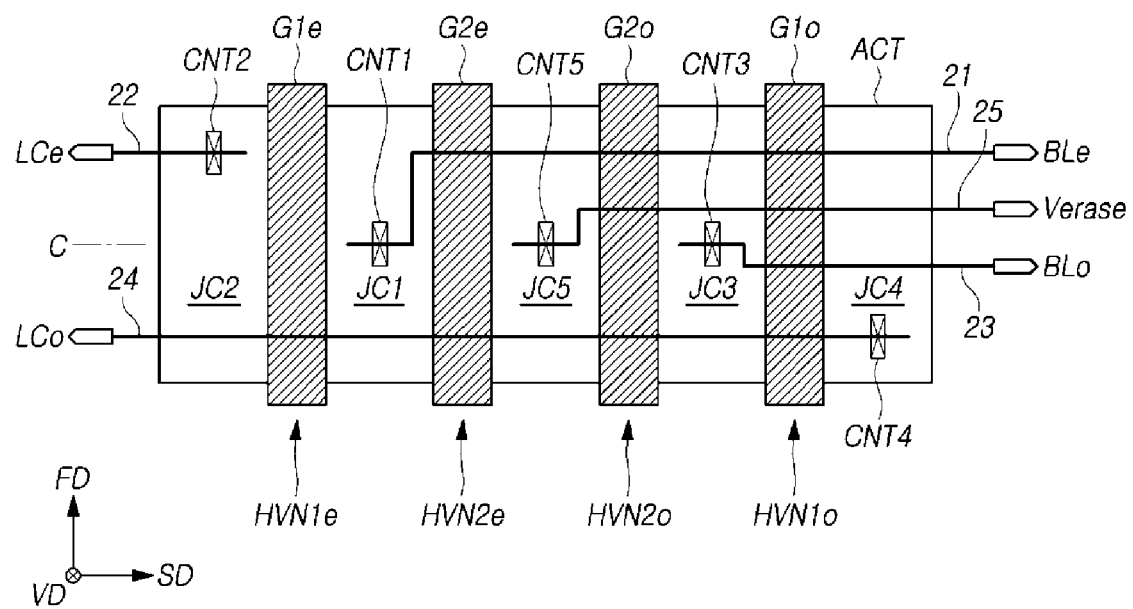
FIG. 8 is a top view illustrating an example of a semiconductor memory device in accordance with an embodiment of the disclosure.

FIG. 8 is a top view illustrating an example of a semiconductor memory device in accordance with an embodiment of the disclosure.

Referring to FIG. 8, first to fourth gate electrodes G1e, G2e, G1o and G2o are defined on and traverse, in a first direction FD, a substrate that is defined with an active region ACT. The first to fourth gate electrodes G1e, G2e, G1o and G2o may extend in the first direction FD, and may be arranged in the second direction SD.

A first junction region JC1 is defined in the active region ACT between the first gate electrode G1e and the second gate electrode G2e. A second junction region JC2 is defined in the active region ACT that is adjacent to the first junction region JC1, in the second direction, with the first gate electrode G1e interposed therebetween. A third junction region JC3 is defined in the active region ACT between the third gate electrode G1o and the fourth gate electrode G2o. A fourth junction region JC4 is defined in the active region ACT that is adjacent to the third junction region JC3, in the second direction, with the third gate electrode G1o interposed therebetween. A fifth junction region JC5 is defined in the active region ACT between the second gate electrode G2e and the fourth gate electrode G2o. The first to fifth junction regions JC1 to JC5 may be disposed substantially in a line in the second direction SD.

The first gate electrode G1e, the first junction region JC1 and the second junction region JC2 may configure an even bit line select transistor HVN1e. The second gate electrode G2e, the first junction region JC1 and the fifth junction region JC5 may configure an even bit line bias transistor HVN2e. The even bit line select transistor HVN1e and the even bit line bias transistor HVN2e may share the first junction region JC1.

The third gate electrode G1o, the third junction region JC3 and the fourth junction region JC4 may configure an odd bit line select transistor HVN1o. The fourth gate electrode G2o, the third junction region JC3 and the fifth junction region JC5 may configure an odd bit line bias transistor HVN2o. The odd bit line select transistor HVN1o and the odd bit line bias transistor HVN2o may share the third junction region JC3. The even bit line bias transistor HVN2e and the odd bit line bias transistor HVN2o may share the fifth junction region JC5.

Although the present embodiment illustrates a case in which the even bit line select transistor HVN1e, the even bit line bias transistor HVN2e, the odd bit line select transistor HVN1o and the odd bit line bias transistor HVN2o are disposed in a single active region, and adjacent transistors share a junction region, it is to be noted that the disclosure is not limited thereto. The transistors may be disposed in separate active regions without sharing junction regions.

A dielectric layer (not illustrated) may be defined on the substrate to cover the transistors HVN1e, HVN2e, HVN1o and HVN2o. A first contact CNT1, which passes through the dielectric layer in a vertical direction VD, may be defined on the first junction region JC1 to be coupled to the first junction region JC1. A second contact CNT2, which passes through the dielectric layer in a vertical direction VD, may be defined on the second junction region JC2 to be coupled to the second junction region JC2. A third contact CNT3, which passes through the dielectric layer in a vertical direction VD, may be defined on the third junction region JC3 to be coupled to the third junction region JC3. A fourth contact CNT4, which passes through the dielectric layer in a vertical direction VD, may be defined on the fourth junction region JC4 to be coupled to the fourth junction region JC4. A fifth contact CNT5, which passes through the dielectric layer in a vertical direction VD, may be defined on the fifth junction region JC5 to be coupled to the fifth junction region JC5.

Wiring lines 21 to 25 may be defined on the dielectric layer to be coupled to the first to fifth contacts CNT1 to CNT5, respectively. The first contact CNT1 may be coupled to an even bit line BLe through the wiring line 21. The second contact CNT2 may be coupled to an even latch LCe through the wiring line 22. The third contact CNT3 may be coupled to an odd bit line BLo through the wiring line 23. The fourth contact CNT4 may be coupled to an odd latch LCo through the wiring line 24. The fifth contact CNT5 may be coupled to an erase voltage Verase through the wiring line 25. The wiring lines 21 to 25 may be routed substantially in the second direction SD, which is also the arrangement direction of the junction regions JC1 to JC5.

In an erase operation, the even bit line bias transistor HVN2e and the odd bit line bias transistor HVN2o may be turned on, and the even bit line select transistor HVN1e and the odd bit line select transistor HVN1o may be turned off. Therefore, in the erase operation, the erase voltage Verase is loaded to the first junction region JC1, the third junction region JC3 and the fifth junction region JC5, but is not loaded to the second junction region JC2 and the fourth junction region JC4. The first junction region JC1, the third junction region JC3 and the fifth junction region JC5, to which the erase voltage Verase is loaded in the erase operation, may be defined as high voltage nodes. The second junction region JC2 and the fourth junction region JC4, to which the erase voltage Verase is not loaded in the erase operation, may be defined as low voltage nodes.

In the erase operation, the even bit line bias transistor HVN2e is turned on and the erase voltage Verase is transferred to the even bit line BLe through the even bit line bias transistor HVN2e. Furthermore, the odd bit line bias transistor HVN2o is turned on and the erase voltage Verase is transferred to the odd bit line BLo through the odd bit line bias transistor HVN2o. Therefore, the erase voltage Verase having a high level may be used only when the BVDSS of the even bit line bias transistor HVN2e and the odd bit line bias transistor HVN2o is kept high.

On the other hand, in an erase operation, since the even bit line select transistor HVN1e and the odd bit line select transistor HVN1o are turned off, the erase voltage Verase having a high level may be used even though the BVDSS of the even bit line select transistor HVN1e and the odd bit line select transistor HVN1o are not kept high.

The first, third and fifth contacts CNT1, CNT3 and CNT5, which are coupled to the first, third and fifth junction regions JC1, JC3 and JC5, are used to configure the even bit line bias transistor HVN2e and the odd bit line bias transistor HVN2o, and may be disposed at or near the center portion of the active region ACT in the first direction FD. The second and fourth contacts CNT2 and CNT4, which are coupled to the second and fourth junction regions JC2 and JC4, may be disposed at or near the edge portions of the active region ACT in the first direction FD.

The second contact CNT2 coupled to the second junction region JC2 and the fourth contact CNT4 coupled to the fourth junction region JC4 may be disposed on both opposite sides, respectively, with respect to an axis C that extends in the second direction SD and passes through the center portion of the active region ACT.

As illustrated in FIG. 8, disposition of the contacts CNT1 to CNT5 may reduce the concentration of the wiring lines 21 to 25 coupled to the contacts CNT1 to CNT5 at the center portion of the active region ACT, and accordingly, the wiring lines 21 to 25 may be disposed using a smaller number of wiring layers.

Figure 9:
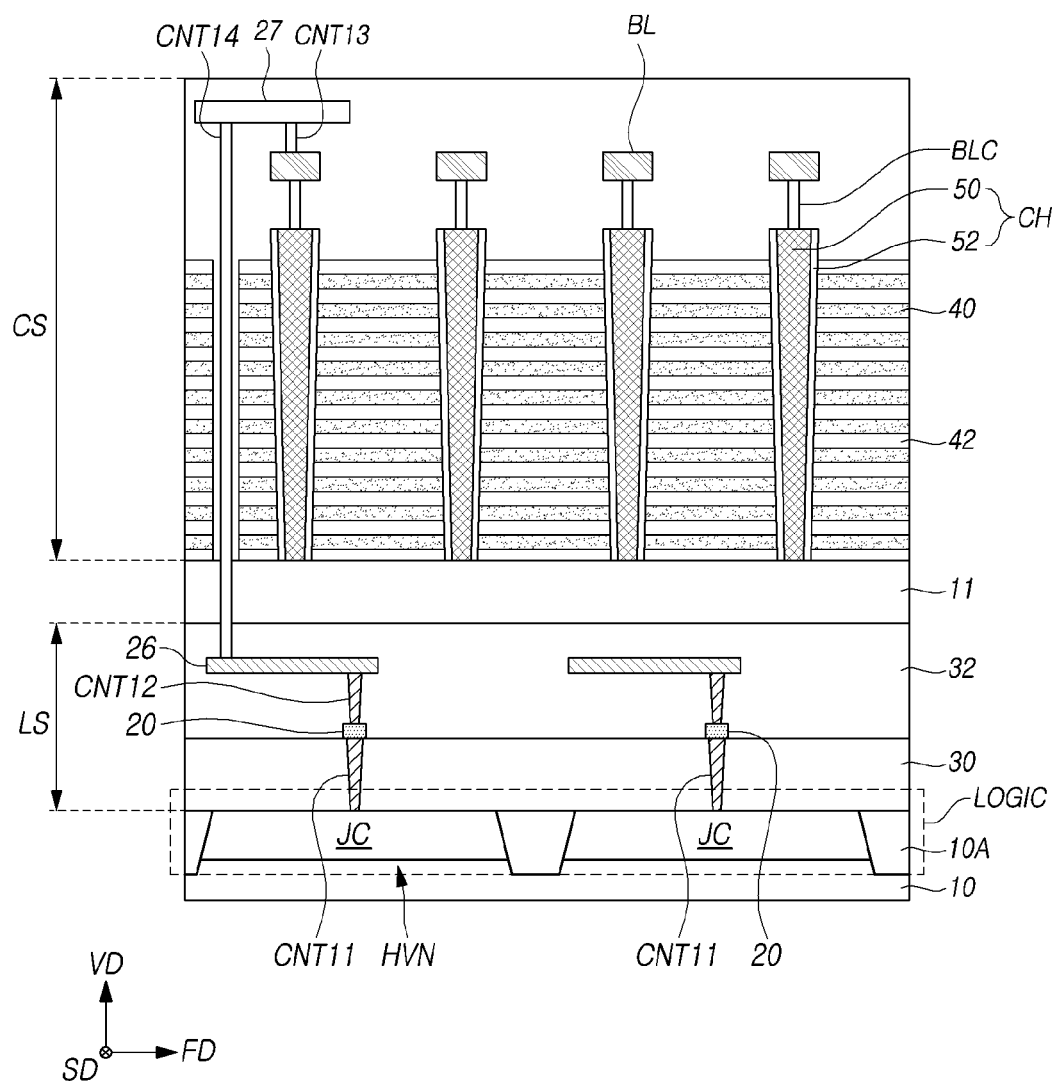
FIG. 9 is a cross-sectional view illustrating an example of a part of a semiconductor memory device in accordance with an embodiment of the disclosure.

FIG. 9 is a cross-sectional view illustrating a representation of an example of a part of a semiconductor memory device in accordance with an embodiment of the disclosure.

Referring to FIG. 9, the semiconductor memory device may have a PUC (peri under cell) structure. A logic structure LS may be disposed under a memory structure CS.

The logic structure LS may be disposed on a first substrate 10, and the memory structure CS may be disposed on a second substrate 11. The first substrate 10 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer. The second substrate 11 may be configured by a polysilicon layer. The second substrate 11 may be formed on a dielectric layer 32 of the logic structure LS, and therefore unlike the first substrate 10 which may use a monocrystalline silicon layer, the second substrate 11 may be configured by a polysilicon layer.

The logic structure LS may include a logic circuit LOGIC. The logic circuit LOGIC may include a row decoder 121, a page buffer circuit 122 and a peripheral circuit 123 described above with reference to FIG. 1. FIG. 9 illustrates a case in which bit lines BL defined in the memory structure CS are coupled to page buffers defined in the logic structure LS. Transistors HVN, illustrated in FIG. 9, may be the bit line select transistors or the bit line bias transistors described above with reference to FIGS. 5 to 8. The reference symbol JC denotes junction regions of the transistors HVN.

A dielectric layer 30 may be defined on the first substrate 10 to cover the logic circuit LOGIC. The dielectric layer 30 may include silicon oxide, for example, HDP (high density plasma) oxide or TEOS (tetra-ethyl-ortho-silicate) oxide. Wiring lines 20 may be disposed on the dielectric layer 30. Contacts CNT11, which pass through the dielectric layer 30 in a vertical direction VD, may be defined under the wiring lines 20 to couple the wiring lines 20 and the junction regions JC of the transistors HVN. A dielectric layer 32 may be defined on the dielectric layer 30 to cover the wiring lines 20. Wiring lines 26 may be defined in the dielectric layer 32. Contacts CNT12 may be defined under the wiring lines 26 to couple the wiring lines 26 and the wiring lines 20.

The memory structure CS may include a plurality of electrode layers 40 and a plurality of interlayer dielectric layers 42 which are alternately stacked on the second substrate 11, and a plurality of vertical channels CH, which pass through the electrode layers 40 and the interlayer dielectric layers 42 in the vertical direction VD.

Among the electrode layers 40, at least one layer from the lowermost layer may configure a source select line, and at least one layer from the uppermost layer may configure a drain select line. The electrode layers 40 between the source select line and the drain select line may configure word lines. The electrode layers 40 may include a conductive material. For example, the electrode layers 40 may include at least one selected among a doped semiconductor (e.g., doped silicon), a metal (e.g., tungsten, copper or aluminum), conductive metal nitride (e.g., titanium nitride or tantalum nitride) and a transition metal (e.g., titanium or tantalum). The interlayer dielectric layers 42 may include silicon oxide.

Each of the vertical channels CH may include a channel layer 50 and a gate dielectric layer 52. The channel layer 50 may include polysilicon or monocrystalline silicon, and may include a P-type impurity such as boron (B) in some regions thereof. While not illustrated, the gate dielectric layer 52 may include a tunnel dielectric layer, a charge storage layer and a blocking layer, which are sequentially stacked from the outer sidewall of the channel layer 50. In some embodiments, the gate dielectric layer 52 may have an ONO (oxide-nitride-oxide) stack structure in which an oxide layer, a nitride layer and an oxide layer are sequentially stacked. Source select transistors, memory cells and drain select transistors may be configured in areas or regions in which the electrode layers 40 surround the vertical channels CH.

The bit lines BL may be defined over the electrode layers 40 and the interlayer dielectric layers 42 that are alternately stacked. Bit line contacts BLC may be defined under the bit lines BL to couple the vertical channels CH and the bit lines BL.

A wiring line 27 may be disposed over each of the bit lines BL. A contact CNT13 may be defined under the wiring line 27 to couple the wiring line 27 and the bit line BL. The wiring line 27 may be coupled to the wiring line 26 of the logic structure LS through a contact CNT14. As a result, electrical paths are configured that couple the bit lines BL and the page buffer circuit of the logic structure LS.

Figure 10:
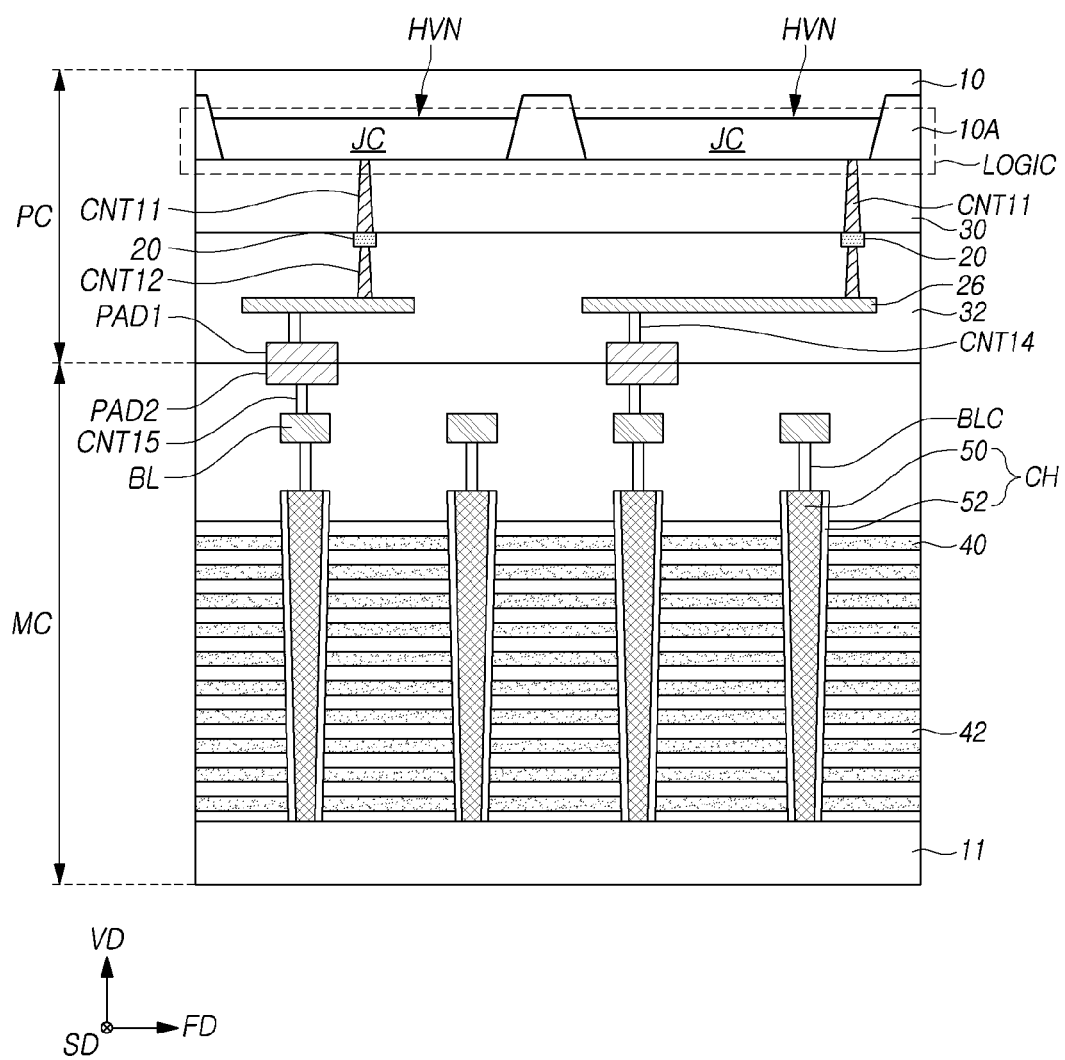
FIG. 10 is a cross-sectional view illustrating an example of a part of a semiconductor memory device in accordance with an embodiment of the disclosure.

FIG. 10 is a cross-sectional view illustrating an example of a part of a semiconductor memory device in accordance with an embodiment of the disclosure.

Referring to FIG. 10, the semiconductor memory device may have a POC (peri over cell) structure. A circuit chip PC including a logic circuit LOGIC may be disposed on a memory chip MC including a memory cell array.

The memory chip MC and the circuit chip PC may be manufactured on different substrates and then bonded to each other. For example, the circuit chip PC may be fabricated on a first substrate 10 and the memory chip MC may be fabricated on a second substrate 11. The first substrate 10 and the second substrate 11 may be made of the same material. Each of the first substrate 10 and the second substrate 11 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer.

First pads PAD1 may be defined on one surface of the circuit chip PC. The first pads PAD1 may be coupled to junction regions JC of transistors HVN, which configure the logic circuit LOGIC, through contacts CNT14, CNT12 and CNT11 and wiring lines 26 and 20. FIG. 10 illustrates a case in which bit lines BL defined in the memory chip MC are coupled to page buffers defined in the circuit chip PC. The transistors HVN illustrated in FIG. 10 may be bit line select transistors or bit line bias transistors described above with reference to FIGS. 5 to 8.

Second pads PAD2 may be defined on one surface of the memory chip MC. The second pads PAD2 may be coupled to the bit lines BL through contacts CNT15.

The one surface of the circuit chip PC and the one surface of the memory chip MC may be bonded such that first pads PAD1 of the circuit chip PC and second pads PAD2 of the memory chip MC are coupled to each other. Accordingly, electrical paths that couple the memory cell array of the memory chip MC and the logic circuit LOGIC of the circuit chip PC may be configured.

According to the embodiments of the disclosure, when a smaller number of wiring layers are used for disposing wiring lines coupled to page buffers, the drain-source breakdown voltage (BVDSS), of transistors that transfer an erase voltage to a memory cell array, may be kept high. Therefore, it is possible to improve the reliability of a semiconductor memory device by suppressing an erase failure phenomenon that may occur if a high erase voltage cannot be used because the BVDSS is not secured or is lowered. In addition, because the number of wiring layers used for the disposition of wiring lines coupled to page buffers may be reduced, the number of manufacturing steps required for the formation of the wiring lines may be reduced, thereby reducing manufacturing time and cost, as well as suppressing failures likely to occur during a manufacturing process.

Figure 11:
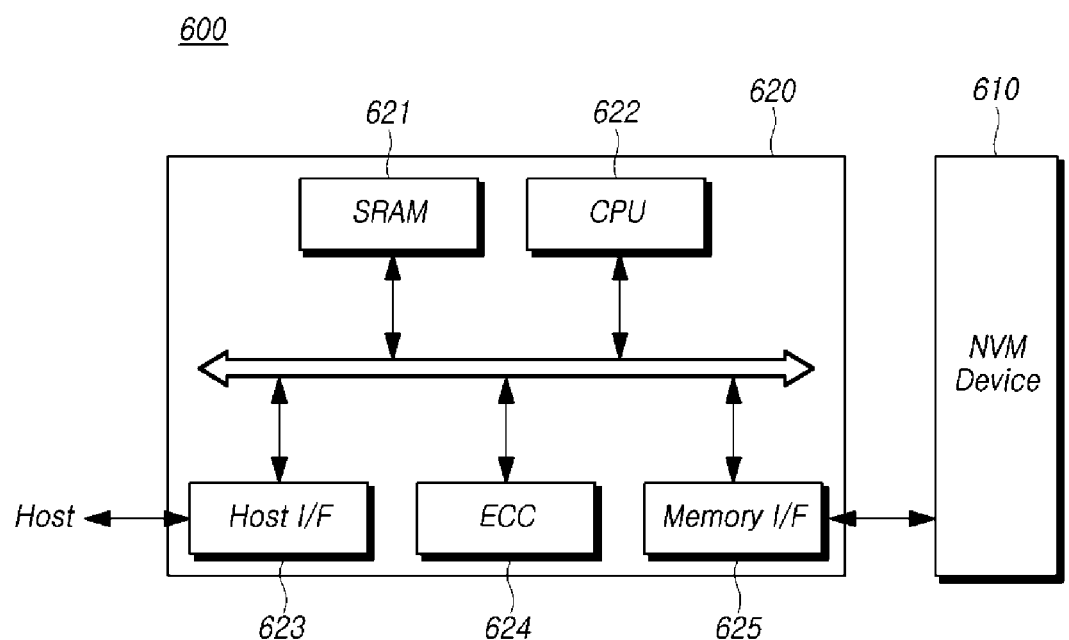
FIG. 11 is a block diagram schematically illustrating a representation of a memory system including a semiconductor memory device in accordance with an embodiment of the disclosure.

FIG. 11 is a block diagram schematically illustrating an example of a memory system including a semiconductor memory device in accordance with an embodiment of the disclosure.

Referring to FIG. 11, a memory system 600 in accordance with an embodiment may include a nonvolatile memory device 610 and a memory controller 620.

The nonvolatile memory device (NVM Device) 610 may be constituted by a semiconductor memory device described above and may operate in the manner described above. The memory controller 620 may be configured to control the nonvolatile memory device 610. The combination of the nonvolatile memory device 610 and the memory controller 620 may be configured as a memory card or a solid state disk (SSD). An SRAM (Static Random Access Memory) 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device 610.

A memory interface (Memory I/F) 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Driving Electronics) protocol.

Figure 12:
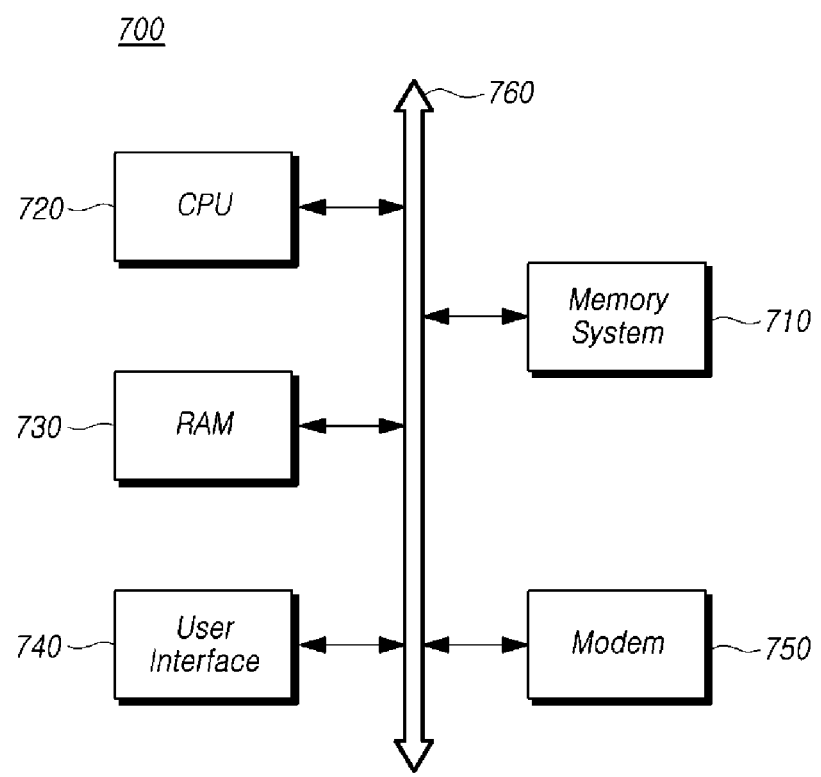
FIG. 12 is a block diagram schematically illustrating a representation of a computing system including a semiconductor memory device in accordance with an embodiment of the disclosure.

FIG. 12 is a block diagram schematically illustrating a computing system including a semiconductor memory device in accordance with an embodiment of the disclosure.

Referring to FIG. 12, a computing system 700 in accordance with an embodiment may include a memory system 710, a microprocessor (CPU) 720, a RAM (Random Access Memory) 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A semiconductor memory device comprising:
at least two transistors, each including a gate that traverses, in a first direction, an active region of a first substrate defined by an isolation layer, and junction regions disposed in the active region on opposite sides of the gate, and coupled to a memory cell array through a bit line; and
a plurality of contacts, coupled respectively to the junction regions, that pass through a dielectric layer that covers the at least two transistors,
wherein, among the plurality of contacts, a contact coupled to a junction region to which an erase voltage is loaded is disposed at a center portion of the active region in the first direction, and a contact coupled to a junction region to which the erase voltage is not loaded is disposed at an edge portion of the active region in the first direction.

2. The semiconductor memory device according to claim 1, wherein
the junction regions include a first junction region coupled to the bit line and a second junction region coupled to a latch, and one of the at least two transistors includes a bit line select transistor that is turned off in an erase operation to decouple the first junction region and the second junction region, and
a contact coupled to the first junction region is disposed at the center portion of the active region in the first direction, and a contact coupled to the second junction region is disposed at the edge portion of the active region in the first direction.

3. The semiconductor memory device according to claim 1, wherein
the junction regions include a first junction region coupled to the bit line and a second junction region coupled to the erase voltage, and one of the at least two transistors includes a bit line bias transistor that is turned on in an erase operation to couple the first junction region and the second junction region, and
a contact coupled to the first junction region and a contact coupled to the second junction region are disposed at the center portion of the active region in the first direction.

4. The semiconductor memory device according to claim 1, wherein
the junction regions include a first junction region that is coupled to the bit line, a second junction region that is coupled to a latch, and a third junction region that is coupled to the erase voltage,
the at least two transistors comprise a bit line select transistor that is turned off in an erase operation to decouple the first junction region and the second junction region, and a bit line bias transistor that is turned on in the erase operation to couple the first junction region and the third junction region, and contacts, coupled to the first junction region and the third junction region, are disposed at the center portion of the active region in the first direction, and a contact coupled to the second junction region is disposed at the edge portion of the active region in the first direction.

5. The semiconductor memory device according to claim 1, further comprising:
a plurality of wiring lines coupled to top ends of the contacts, respectively, wherein the wiring lines are routed in a second direction in which junction regions are arranged.

6. The semiconductor memory device according to claim 1, wherein the memory cell array is disposed on a second substrate over the dielectric layer.

7. The semiconductor memory device according to claim 1, further comprising:
a memory chip including the memory cell array and the bit line, and defined with a first pad, which is coupled with the memory cell array, on one surface thereof; and
a circuit chip comprising a logic circuit that includes the at least two transistors, the contacts, and a second pad defined on one surface thereof and coupled with the logic circuit,
wherein the one surface of the memory chip and the one surface of the circuit chip are bonded with each other such that the first pad and the second pad are coupled with each other.

8. The semiconductor memory device according to claim 1, wherein the memory cell array comprises:
a plurality of electrode layers and a plurality of interlayer dielectric layers stacked alternately on a second substrate; and
a plurality of vertical channels passing through the plurality of electrode layers and the plurality of interlayer dielectric layers.

9. A semiconductor memory device comprising:
an active region of a first substrate defined by an isolation layer;
a first transistor including a gate that traverses, in a first direction, the active region on the first substrate, and junction regions that are defined in the active region on opposite sides of the gate, and coupled to a memory cell array through an even bit line;
a second transistor including a gate which traverses, in the first direction, the active region on the first substrate, and junction regions that are defined in the active region on opposite sides of the gate, and coupled to the memory cell array through an odd bit line; and
a plurality of contacts, coupled to the junction regions of the first and second transistors, that pass through a dielectric layer covering the first and second transistors,
wherein, among the plurality of contacts, a contact coupled to a junction region to which an erase voltage is loaded is disposed at a center portion of the active region in the first direction, and a contact coupled to a junction region to which the erase voltage is not loaded is disposed at an edge portion of the active region in the first direction.

10. The semiconductor memory device according to claim 9, wherein
the junction regions include a first junction region coupled with the even bit line, a second junction region coupled with an even latch, a third junction region coupled with the odd bit line, and a fourth junction region coupled with an odd latch,
the first transistor includes an even bit line select transistor that is turned off in an erase operation to decouple the first junction region and the second junction region, and the second transistor includes an odd bit line select transistor that is turned off in the erase operation to decouple the third junction region and the fourth junction region, and
contacts coupled to the first junction region and the third junction region are disposed at the center portion of the active region in the first direction, and contacts coupled to the second junction region and the fourth junction region are disposed at the edge portion of the active region in the first direction.

11. The semiconductor memory device according to claim 10, wherein the contact coupled to the second junction region and the contact coupled to the fourth junction region are disposed at opposite sides of an axis that extends in a second direction and passes through the center portion of the active region.

12. The semiconductor memory device according to claim 9, wherein
the junction regions include a first junction region coupled with the even bit line, a second junction region coupled with the odd bit line, and a third junction region coupled with the erase voltage,
the first transistor includes an even bit line bias transistor that is turned on in an erase operation to couple the first junction region and the third junction region, and the second transistor includes an odd bit line bias transistor that is turned on in the erase operation to couple the second junction region and the third junction region, and
contacts coupled to the first to third junction regions are disposed at the center portion of the active region in the first direction.

13. The semiconductor memory device according to claim 9, wherein
the junction regions include a first junction region coupled with the even bit line, a second junction region coupled with an even latch, a third junction region coupled with the odd bit line, a fourth junction region coupled with an odd latch, and a fifth junction region coupled with the erase voltage,
the first transistor includes an even bit line select transistor that is turned off in an erase operation to decouple the first junction region and the second junction region, and an even bit line bias transistor that is turned on in the erase operation to couple the first junction region and the fifth junction region,
the second transistor includes an odd bit line select transistor that is turned off in the erase operation to decouple the third junction region and the fourth junction region, and an odd bit line bias transistor that is turned on in the erase operation to couple the third junction region and the fifth junction region, and
contacts coupled to the first junction region, the third junction region and the fifth junction region are disposed at the center portion of the active region in the first direction, and contacts coupled to the second junction region and the fourth junction region are disposed at the edge portion of the active region in the first direction.

14. The semiconductor memory device according to claim 13, wherein the contact coupled to the second junction region and the contact coupled to the fourth junction region are disposed at opposite sides of an axis that extends in a second direction and passes through the center portion of the active region.

15. The semiconductor memory device according to claim 9, further comprising:
   a plurality of wiring lines coupled to top ends of the contacts, respectively, wherein the wiring lines are routed in a second direction in which junction regions are arranged.

16. The semiconductor memory device according to claim 9, wherein the memory cell array is disposed on a second substrate over the dielectric layer.

17. The semiconductor memory device according to claim 9, further comprising:
   a memory chip including the memory cell array, the even bit line and the odd bit line, and defined with a first pad, which is coupled with the memory cell array, on one surface thereof; and
   a circuit chip comprising a logic circuit that includes the first and second transistors, and a second pad defined on one surface thereof and coupled with the logic circuit,
   wherein the one surface of the memory chip and the one surface of the circuit chip are bonded with each other such that the first pad and the second pad are coupled with each other.

* * * * *